United States Patent
Choi et al.

(10) Patent No.: US 10,488,720 B2
(45) Date of Patent: Nov. 26, 2019

(54) DISPLAY APPARATUS AND ELECTRONIC DEVICE

(71) Applicant: SAMSUNG DISPLAY CO., LTD., Yongin-si, Gyeonggi-do (KR)

(72) Inventors: Sukho Choi, Cheonan-si (KR); Euttum Kim, Cheonan-si (KR); Joonsam Kim, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/440,329

(22) Filed: Feb. 23, 2017

(65) Prior Publication Data
US 2017/0256583 A1 Sep. 7, 2017

(30) Foreign Application Priority Data

Mar. 7, 2016 (KR) .................. 10-2016-0027270

(51) Int. Cl.
*G02F 1/1345* (2006.01)
*H01L 23/00* (2006.01)
*H05K 3/32* (2006.01)

(52) U.S. Cl.
CPC .......... *G02F 1/13452* (2013.01); *H01L 24/17* (2013.01); *H01L 24/32* (2013.01);
(Continued)

(58) Field of Classification Search
CPC ......... H01L 24/73; H01L 24/32; H01L 24/17; H01L 2224/16227; H01L 2224/16148; H01L 2224/32225; H01L 2924/12044; H01L 2924/1426; H01L 2924/13069; H01L 2224/2919; H01L 2924/3511; H01L 23/48; H01L 23/49572; H01L 2224/50; H01L 2224/79; H01L 2225/06579; H01L 2224/107; H01L 24/50; H01L 2224/1703; H01L 2224/73204; H01L 2224/32135; H01L 224/86; G02F 1/13452; G02F 1/0121; G02F 1/0327; G02F 1/076; G02F 1/133; G02F 1/13306; G02F 1/1345; G02F 1/13454; G02F 1/13458; G02F 2001/133388; G02F 2001/133612;
(Continued)

(56) References Cited

U.S. PATENT DOCUMENTS 6,297,868 B1 * 10/2001 Takenaka ............ G02F 1/13452
349/151
2002/0012096 A1 * 1/2002 Uchiyama ........... G02F 1/13452
349/187
(Continued)

FOREIGN PATENT DOCUMENTS

KR 10-2012-0126770 A 11/2012
KR 10-2017-0053212 A 5/2017

*Primary Examiner* — Shan Liu
(74) *Attorney, Agent, or Firm* — Kile Park Reed & Houtteman PLLC

(57) ABSTRACT

A display apparatus includes a display panel, a driving integrated circuit (IC), and an anisotropic conductive film. The display panel includes a non-display area adjacent to a display area and an upper substrate and a lower substrate. The driving IC overlaps the non-display area. The anisotropic conductive film attaches the driving IC to the lower substrate and includes conductive balls with diameters that gradually increase toward the display area.

9 Claims, 8 Drawing Sheets

(52) U.S. Cl.
CPC ............. *H01L 24/73* (2013.01); *H05K 3/323* (2013.01); *H01L 2224/16148* (2013.01); *H01L 2224/16227* (2013.01); *H01L 2224/1703* (2013.01); *H01L 2224/2919* (2013.01); *H01L 2224/32135* (2013.01); *H01L 2224/32225* (2013.01); *H01L 2224/73204* (2013.01); *H01L 2924/12044* (2013.01); *H01L 2924/13069* (2013.01); *H01L 2924/1426* (2013.01); *H01L 2924/3511* (2013.01); *H05K 2201/0266* (2013.01); *H05K 2201/10128* (2013.01)

(58) Field of Classification Search
CPC .......... G02F 2001/13456; H05K 3/323; H05K 2201/0266; H05K 2201/10128

USPC .................................................. 349/149–152
See application file for complete search history.

(56) References Cited

U.S. PATENT DOCUMENTS

| | | | |
|---|---|---|---|
| 2005/0157244 A1* | 7/2005 | Hwang | H01L 23/4824 349/151 |
| 2006/0022340 A1* | 2/2006 | Ho | H01L 24/12 257/750 |
| 2009/0039495 A1* | 2/2009 | Yamashita | H01L 23/49838 257/690 |
| 2011/0100692 A1* | 5/2011 | Topacio | H05K 3/3436 174/260 |
| 2013/0120948 A1* | 5/2013 | Sato | H01L 24/81 361/773 |
| 2015/0001740 A1* | 1/2015 | Shi | H01L 25/0657 257/784 |
| 2015/0098035 A1* | 4/2015 | Saitou | G02F 1/13452 349/33 |
| 2017/0012081 A1* | 1/2017 | Shen | H01L 27/14687 |
| 2017/0207190 A1* | 7/2017 | Tsukao | H01L 24/73 |
| 2017/0278820 A1* | 9/2017 | Shinohara | H01L 24/29 |
| 2017/0352967 A1* | 12/2017 | Hayashi | H01R 11/01 |
| 2018/0168044 A1* | 6/2018 | Tsukao | G02F 1/1345 |

* cited by examiner

DISPLAY APPARATUS AND ELECTRONIC DEVICE

CROSS-REFERENCE TO RELATED APPLICATION

Korean Patent Application No. 10-2016-0027270, filed on Mar. 7, 2016, and entitled, "Display Apparatus and Electronic Device," is incorporated by reference herein in its entirety.

BACKGROUND

1. Field

One or more embodiments described herein relate to a display apparatus and an electronic device.

2. Description of the Related Art

A variety of displays have been developed. Examples include liquid crystal displays, plasma displays, field emission displays, light emitting diode displays, and organic light emitting diode displays. These displays include a driving IC for controlling the display of an image on a display panel. The driving IC may be in the form of a chip.

Many methods have been proposed for bonding a driving IC to a display panel. Examples include a tape automated bonding (TAB) method or a chip-on-glass (COG) method. In the TAB method, a driving IC is mounted on a tape carrier package (TCP). The TCP is then bonded to a pad of a display panel. In the COG method, a driving IC is directly bonded to a pad of a display panel. A chip-on-film (COF) method may be used to directly bond a driving IC to a flexible circuit board attached to a display panel.

SUMMARY

In accordance with one or more embodiments, a display apparatus includes a display panel including a non-display area adjacent to a display area, the display panel including display substrate a display substrate; a driving integrated circuit (IC) overlapping the non-display area on a plane and on the display substrate; and an anisotropic conductive film between the display substrate and the driving IC, the anisotropic conductive film attaching the driving IC to the display substrate, wherein the anisotropic conductive film includes a first conductive ball group which includes conductive balls having diameters that gradually increase toward the display area.

The anisotropic conductive film may include a second ball group that is farther away from the display area than the first conductive ball group. The second conductive ball group may include conductive balls having a same diameter. The driving IC may include a driving chip to drive the display panel; output bumps between the driving chip and the display substrate and contacting the first conductive ball group; and input bumps between the driving chip and the display substrate and contacting the second conductive ball group, wherein the output bumps are in a plurality of columns in a first side direction of the driving chip and wherein the input bumps are in a line in the first side direction of the driving chip.

The second conductive ball group may include conductive balls having diameters that gradually increase in a direction away from the display area. The driving IC may include a driving chip to drive the display panel; output bumps between the driving chip and the display substrate and contacting the first conductive ball group; and input bumps between the driving chip and the display substrate and contacting the second conductive ball group, wherein the input bumps and the output bumps are arranged in a plurality of columns in a first side direction of the driving chip.

The driving IC may include a driving chip to drive the display panel; output bumps between the driving chip and the display substrate and contacting the first conductive ball group; and input bumps between the driving chip and the display substrate and contacting the second conductive ball group. The number of output bumps may be greater than a number of input bumps. The display panel may include output pads facing the output bumps with the first conductive ball group therebetween; and input pads facing the input bumps with the second conductive ball group therebetween.

Distances between centers of adjacent conductive balls of the second conductive ball group may be equal. Distances between centers of the adjacent conductive balls of the first conductive ball group are equal. The anisotropic conductive film includes an adhesion resin may adhere the driving IC to the display substrate.

In accordance with one or more other embodiments, a display apparatus includes a display panel including a non-display area adjacent to a display area, the display panel including an upper substrate and a display substrate; a flexible circuit board attached to the display substrate; a driving integrated circuit (IC) overlapping the flexible circuit board and on the flexible circuit board; and an anisotropic conductive film between the flexible circuit board and the driving IC and attaching the driving IC to the flexible circuit board, wherein the anisotropic conductive film includes a first conductive ball group and wherein the first conductive ball group includes conductive balls having diameters that gradually increase toward the display area.

The anisotropic conductive film may include a second conductive ball group that is farther away from the display area than the first conductive ball group. The second conductive ball group may include conductive balls having a same diameter. The second conductive ball group may include conductive balls having diameters that gradually increase in a direction away from the display area.

In accordance with one or more other embodiments, an electronic device includes a base substrate; a driving integrated circuit (IC) on the base substrate; and an anisotropic conductive film between the base substrate and the driving IC and attaching the driving IC to the base substrate, wherein the driving IC includes an input to receive an external signal and an output to apply a signal to the base substrate, wherein the anisotropic conductive film includes a first conductive ball group between the output part and the base substrate, and wherein the first conductive ball group includes conductive balls having diameters that gradually increase in a direction away from the input part.

The anisotropic conductive film may include a second conductive ball group between the input part and the base substrate. The second conductive ball group includes conductive balls having a same diameter. The second conductive ball group may include conductive balls having diameters that gradually increase in a direction away from the output part.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
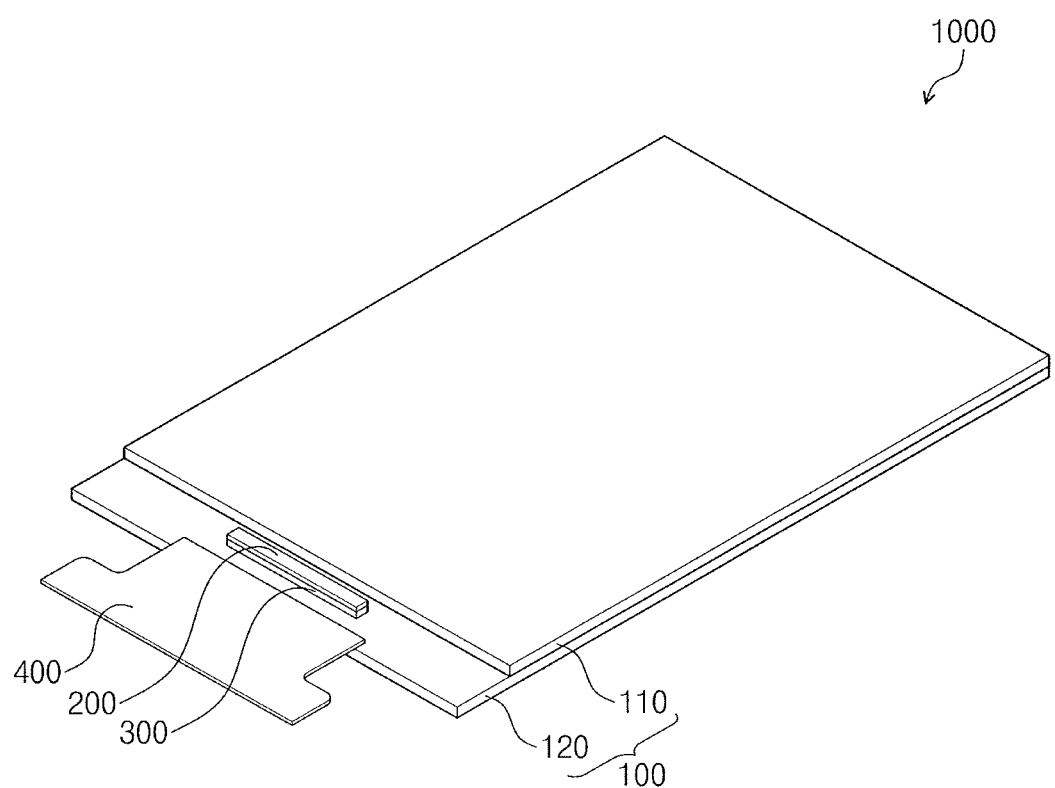
FIG. 1 illustrates an embodiment of a display apparatus.

Example embodiments are described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
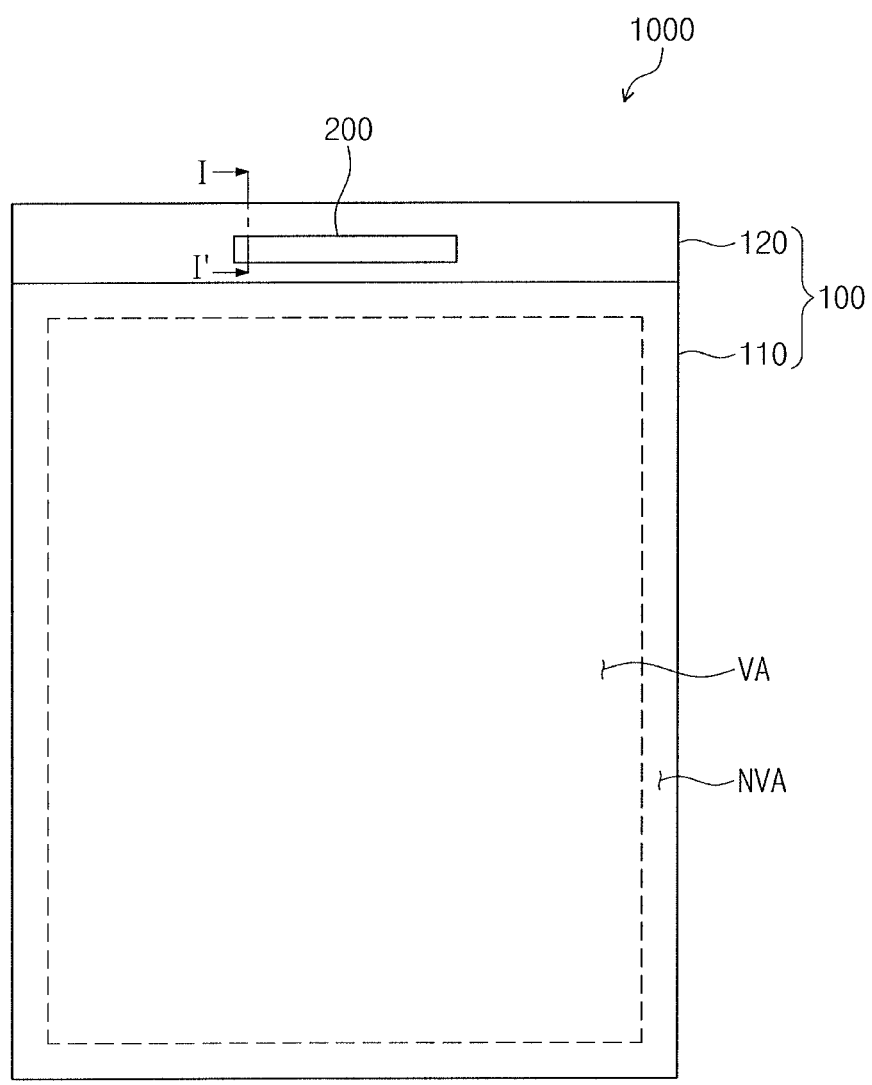
FIG. 2 illustrates another view of the display apparatus.

FIG. 1 illustrates an embodiment of a display apparatus 1000, and FIG. 2 is a plan view of the display apparatus 1000. Referring to FIGS. 1 and 2, the display apparatus 1000 includes a display panel 100, a driving IC 200, an anisotropic conductive film 300, and a flexible circuit board 400. The display panel 100 may be a self-emissive display panel (e.g., an organic light emitting display panel). In one embodiment, the display panel 100 may display an image using surrounding light without emitting light. For example, the display panel 100 may be one of a liquid crystal display panel, an electrophoretic display panel, or an electrowetting display panel.

The display panel 100 may include gate lines, data lines, thin film transistor, and pixel electrode. The gate lines and the data lines may be insulated from each other and may cross each other. The thin film transistor may be a three-terminal device connected to one gate line, one data line, and one pixel electrode. A data voltage on a data line may be applied to the pixel electrode based on a signal applied to the gate line.

The display panel 100 may include a display area VA to display an image and a non-display area NVA adjacent to the display area VA. At least one line may be provided to display an image in the non-display area NVA.

The display panel 100 includes a display substrate. In detail, the display substrate includes an upper substrate 110 and a lower substrate 120. Hereinafter, the display panel is described as the lower substrate 120. The upper substrate 110 may be on the lower substrate 120. In one embodiment, the size of the upper substrate 110 may be less than the lower substrate 120 on a plane. Thus, a portion of the lower substrate 120 may be exposed through the upper substrate 110.

The driving IC 200 provides a gate signal and/or a data signal to drive the display panel 100. The driving IC 200 overlaps the non-display area NVA on a plane and is mounted on the lower substrate 120. The driving IC 200 may be attached to the lower substrate 120, for example, by a chip-on-glass (COG) method.

The anisotropic conductive film 300 is between the lower substrate 120 and the driving IC 200. The anisotropic conductive film 300 attaches the driving IC 200 to the lower substrate 120. The anisotropic conductive film 300 includes a conductive material to allow a signal from the driving IC 200 to be transmitted to the display panel 100.

The flexible circuit board 400 is connected to an external system and a power supply unit. The flexible circuit board 400 supplies control signals, power, and other signals to the display panel 100 and the driving IC 200. The flexible circuit board 400 is spaced farther away from the display area VA than the driving IC 200. The flexible circuit board 400 is attached to the lower substrate 120. An anisotropic conductive film is between the flexible circuit board 400 and the lower substrate 120. The flexible circuit board 400 and the lower substrate 120 may be attached to each other by the anisotropic conductive film.

Figure 3:
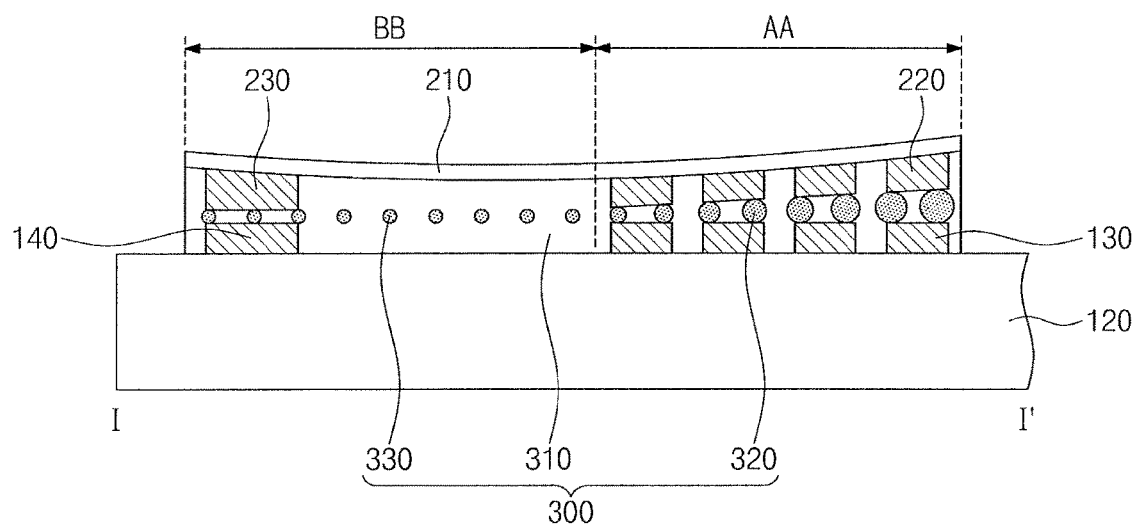
FIG. 3 illustrates another view of the display apparatus.

FIG. 3 is a cross-sectional view of the display apparatus 1000 taken along line I-I' of FIG. 2. Referring to FIG. 3, the display panel 100 further includes output pads 130 and input pads 140. The output pads 130 and the input pads 140 are between the lower substrate 120 and the driving IC 200. The output pads 130 are on an output region AA. The input pads 140 are on an input region BB. The output pads 130 and the input pads 140 contact the lower substrate 120. The output pads 130 and the input pads 140 are connected to lines in the lower substrate 120 for providing an image.

The input pads 140 receive control signals, power, and other signals from the flexible circuit board 400 and provides these signals and power to the driving IC 200. Thus, the input pads 140 may be located close or adjacent to flexible circuit board 400.

The output pads 130 receive a driving signal and other signals from the driving IC 200 for input into the display panel 100. The output pads 130 may be closer to the display area VA than the input pads 140. The output pads 130 correspond to output bumps 220. The input pads 140 correspond to input bumps 230. In one embodiment, the same number of output pads 130 and output bumps 220 may be provided. Also, in one embodiment, the same number of input pads 140 and input bumps 230 may be provided.

The driving IC 200 includes a driving chip 210 to drive the display panel 100, the output bumps 220, and the input bumps 230. The output bumps 220 and the input bumps 230 are between the driving chip 210 and the lower substrate 120. The output bumps 220 are between the driving chip 210 and the output pads 130. The input pads 230 are between the driving chip 210 and the input pads 140. The output bumps 220 and the input bumps 230 contact the bottom surface of the driving chip 210.

The input bumps 230 receive control signals, power, and other signals from the input pads 140. The input bumps 230 correspond and are electrically connected to the input pads 140, respectively. The output bumps 220 supply driving signals and other signals to the output pads 130. The output bumps 220 correspond and are electrically connected to the output pads 130, respectively.

The input bumps 230 receive signals from the flexible circuit board 400. The output bumps 220 supply driving signals to the display panel 100. Thus, the input pads 230 may be closer to the flexible circuit board 400 than the input bumps 230 and may be farther away from the display area VA.

The anisotropic conductive film 300 may includes an adhesion resin 310, a first conductive ball group 320, and a second conductive ball group 330. The adhesion resin 310 allows the driving IC 200 to adhere to the lower substrate 120. The adhesion resin 310 includes a material having strong adhesive force with respect to metal or plastic. The adhesion resin 310 includes an insulating material. When the adhesion resin 310 includes a conductive material, a short circuit may be created between the driving IC 200 and lines of the lower substrate 120, and an error may occur in a signal transmitting process between the driving IC 200 and the lower substrate 120.

The first conductive ball group 320 and the second conductive ball group 330 are surrounded by the adhesion resin 310. The first conductive ball group 320 is in the output region AA. The first conductive ball group 320 may be between the output pads 130 and the output bumps 220. The second conductive ball group 330 is in the input region BB. The second conductive ball group 330 may be between the input pads 140 and the input bumps 230. The first conductive ball group 320 may be closer to the display area VA than the second conductive ball group 330.

The first conductive ball group 320 contacts the output pads 130 and the output bumps 220 to electrically connect the output pads 130 to the output bumps 220. The second conductive ball group 330 contacts the input pads 140 and the input bumps 230 to electrically connect the input pads 140 to the input bumps 230. Each of the first conductive ball group 320 and the second conductive ball group 330 includes a conductive material.

Each of the first conductive ball group 320 and the second conductive ball group 330 have a predetermined (e.g., spherical) shape and elasticity. The first conductive ball group 320 may be deformed by pressure between the output pads 130 and the output bumps 220. The second conductive ball group 330 may be deformed by pressure between the input pads 140 and the input bumps 230. Each of the first conductive ball group 320 and the second conductive ball group 330 may include an elastomer (e.g., of a polymer material) and a metallic conductive layer on a surface of the elastomer to obtain elasticity and conductivity.

Figure 4:
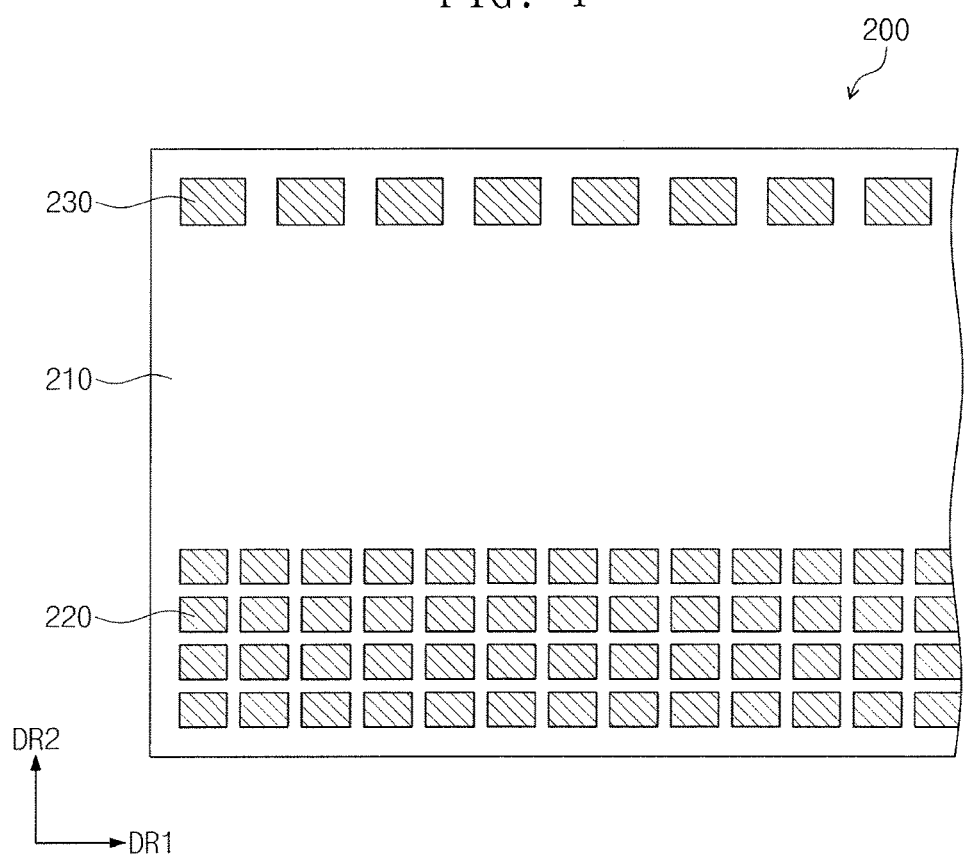
FIG. 4 illustrates an embodiment of a driving IC.

FIG. 4 illustrates an embodiment of a bottom view of the driving IC 200. The input bumps 230 may be in a line in a long side direction DR1 of the driving IC 210. The output bumps 220 may be in one or more columns in the long side direction DR1 of the driving IC 210. Referring to FIG. 4, the input bumps 230 are in a line in the long side direction DR1 of the driving IC 210. The output bumps 220 are in four columns in the long side direction DR1 of the driving IC 210.

The number of output bumps 220 may be greater than the number of input bumps 230. The input bumps 230 may have a surface area greater than the output bumps 220 on a plane. In various embodiments, the size and/or number of the input bumps 230 and the output bumps 220 may be the same or different. The output bumps 220, the input bumps 230, the output pads 130, and the input pads 140 have predetermined sizes. In one embodiment, the size of the output bumps 220 may be less than the output pads 130, and the size of the input pads 230 may be less than the input pads 140.

Figure 5:
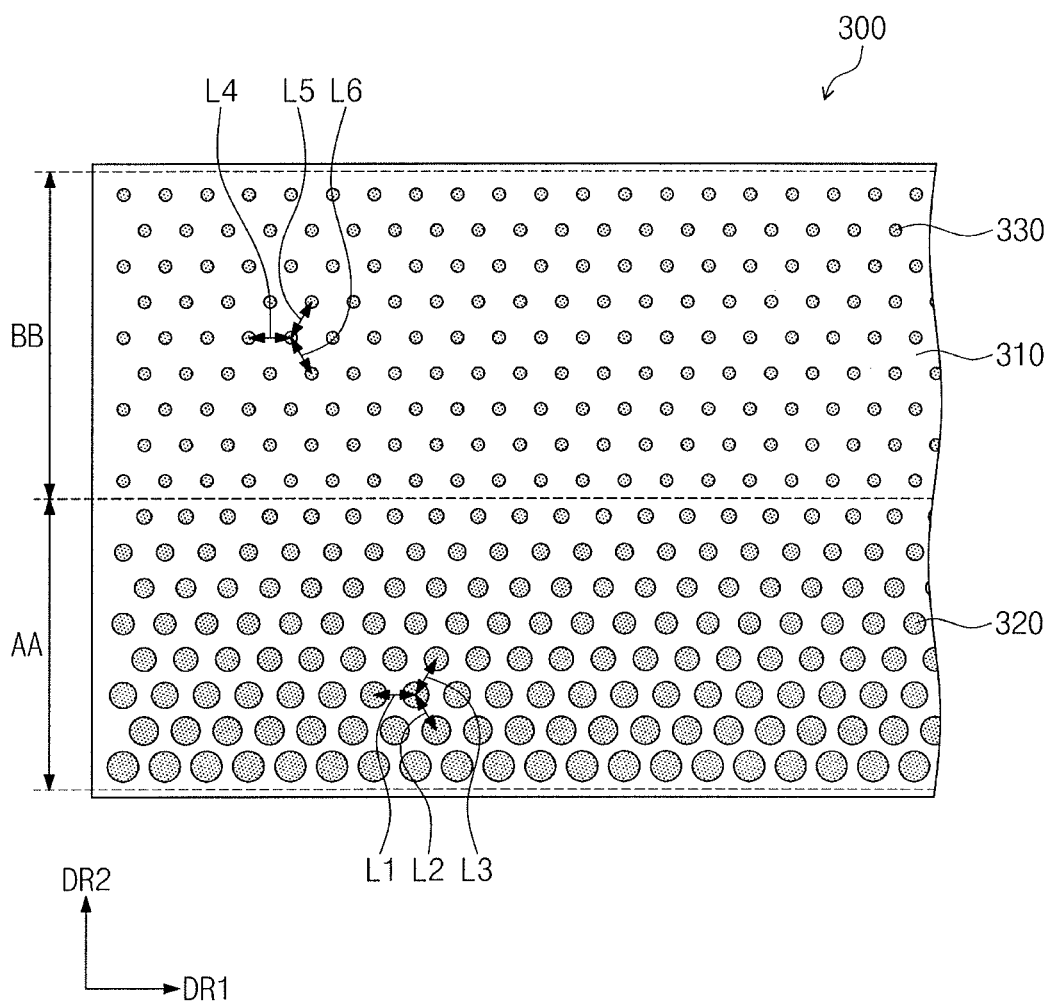
FIG. 5 illustrates an embodiment of an anisotropic conductive film.

FIG. 5 illustrates an embodiment of the anisotropic film 300. Referring to FIG. 5, the first conductive ball group 320 includes conductive balls having diameters that gradually decrease in a short side direction DR2. The short side direction DR2 is directed away from the display area VA. The first conductive ball group 320 includes conductive balls having diameters that gradually increase to the display area VA. The second conductive ball group 330 includes conductive balls having the same diameter.

Since distances between the output bumps 220 and the output pads 130 gradually decrease in the short side direction DR2, the first conductive ball group 320 includes the conductive balls that gradually increase to the display area VA.

Referring to FIGS. 3 and 5, when the driving IC 200 and the lower substrate 120 are pressurized, a phenomenon of warpage may occur in the driving chip 210. For example, the driving chip 210 may be bent and inserted into a space between the input bumps 230 and the output bumps 220. As a result, the more the driving chip 210 approaches the display area VA, the more the distance between the output bumps 220 and the output pads 130 gradually increases.

For example, the first conductive ball group 320 adjacent to the second conductive ball group 330 may include conductive balls, each of which has a diameter ranging from about 3.0 μm to about 3.2 μm. The first conductive ball group 320 includes conductive balls having diameters that gradually increase to the display area VA. The first conductive ball group 320 may include the conductive balls adjacent to the display area VA and each of which has a diameter ranging from about 3.2 μm to about 3.5 μm.

When the input bumps 230 are in a line, distances between the input bumps 230 and the input pads 140 are constant even when warpage occurs. Therefore, the input bumps 230 are electrically connected to the input pads 140 through the second conductive ball group 230, even though the second conductive ball group 330 includes conductive balls having the same diameter.

Distances between centers of adjacent conductive balls in the first conductive ball group 320 (e.g., first center distances L1, L2, and L3) may be the same. For example, the three first center distances L1, L2, and L2 are in FIG. 5. Distances between centers of conductive balls adjacent to each other of conductive balls of the second conductive ball group 330 (e.g., second center distances L4, L5, and L6) may be the same. For example, three second center distances L4, L5, and L2 are in FIG. 5.

When the first center distances L1, L2, L3 are the same, the number of conductive balls respectively disposed in spaces between the output bumps 220 and the output pads 130 may be constant. When the second center distances L4, L5, L6 are the same, the number of conductive balls respectively disposed in spaces between the input bumps 230 and the input pads 140 may be constant. Each of the first center distances L1, L2, and L3 and the second center distances L4, L5, and L6 may be the same.

For example, when the first conductive ball group 320 includes conductive balls, each of which has a diameter ranging from about 3 to about 4 μm, at least five conductive balls may be between one of the output bumps 220 and one of the output pads 130 corresponding to the one of the output bumps 220. When the first conductive ball group 320 includes conductive balls that are irregularly disposed, five or less of conductive balls may be between one of the output bumps 220 and one of the output pads 130. When the first center distances L1, L2, and L3 are the same, at least five conductive balls may be between the output bumps 220 and the output pads 130. Thus, a conductive failure resulting from a low density of conductive balls may be prevented.

Figure 6:
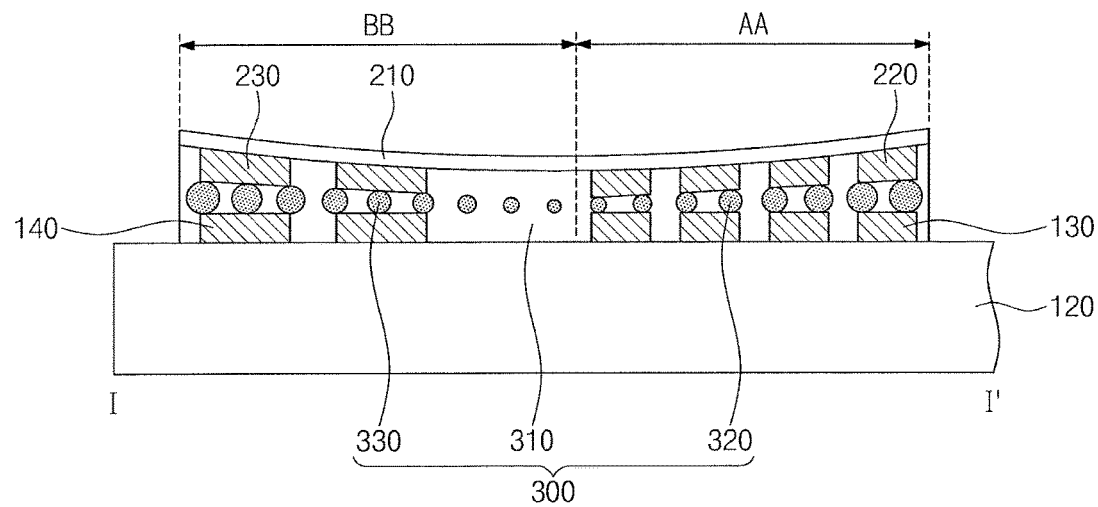
FIG. 6 illustrates another embodiment of a display apparatus.
Figure 7:
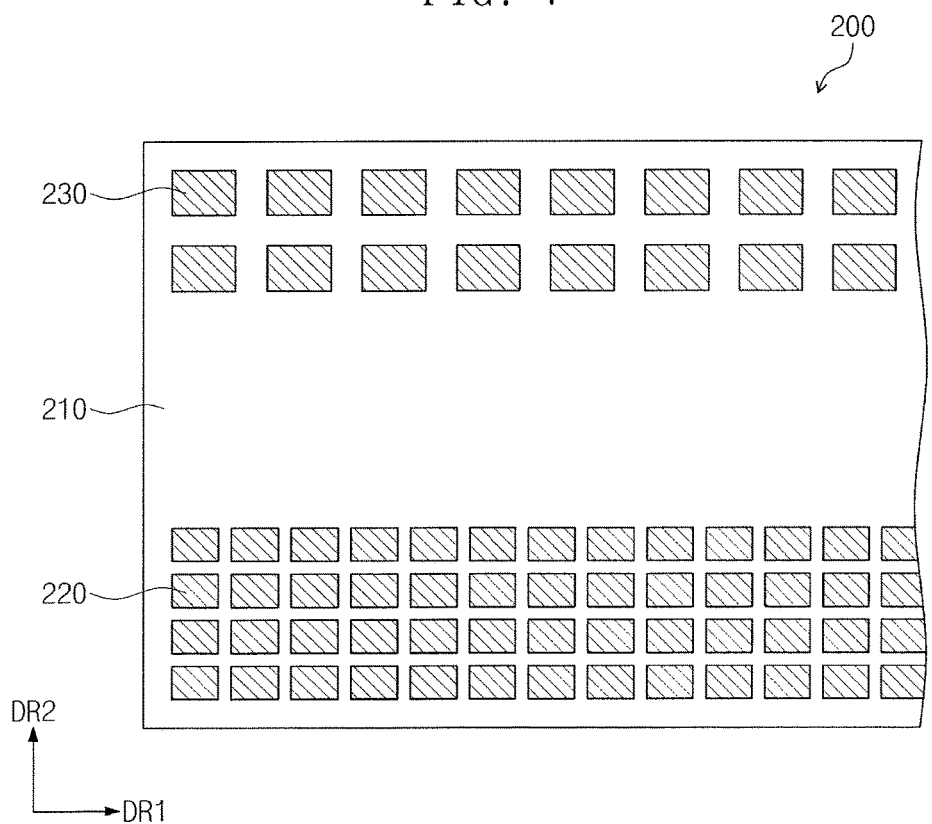
FIG. 7 illustrates another embodiment of a driving IC.
Figure 8:
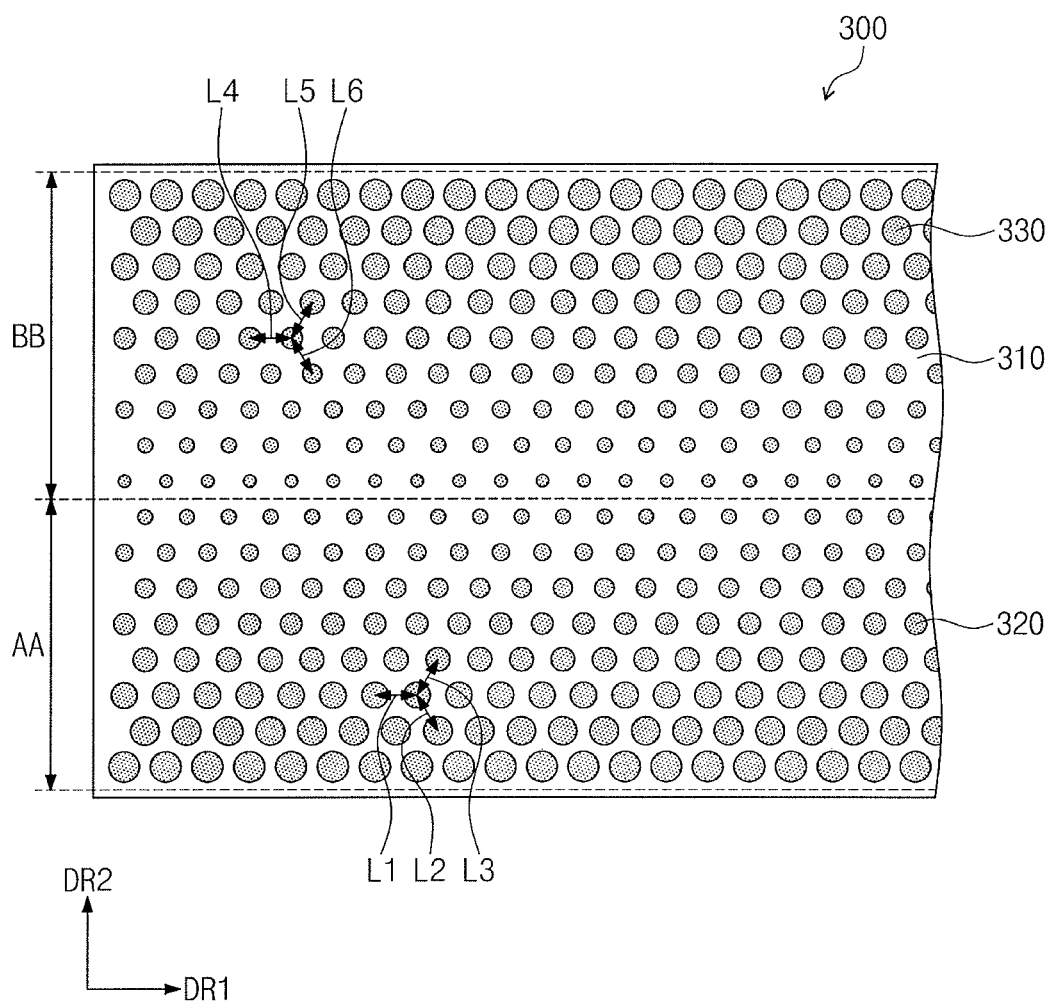
FIG. 8 illustrates another embodiment of an anisotropic conductive film.

FIG. 6 illustrates a cross-sectional view of another embodiment of a display apparatus 1000 taken along line I-I' of FIG. 2. FIG. 7 illustrates an embodiment of a bottom view of a driving IC 200. FIG. 8 is a plan view of another embodiment of an anisotropic conductive film 300. Components, except for the input pads 140, the input bumps 230, and the second conductive ball group 330, may be the same as in FIG. 3.

Referring to FIGS. 6 and 7, the input bumps 230 may be arranged in a plurality of columns in the long side direction DR1 of the driving IC 210. For example, the input bumps 230 may be in two columns in the long side direction DR1 of the driving IC 210.

When the driving IC 200 and the lower substrate 120 are pressurized, warpage may occur in the driving chip 210. For example, the driving chip 210 may be bent and inserted into a space between the input bumps 230 and the output bumps 220. Thus, distances between the input bumps 230 and input pads 140 gradually increase in a direction away from the display area VA. The diameter of a conductive ball may increase, for example, by a distance between the input bumps 230 and input pads 140 in order to electrically connect the input bumps 230 to the input pads 140. Therefore, a second conductive ball group 330 may include conductive balls having diameters that gradually increase in a direction away from the display area VA.

The number of output bumps 220 may be greater than the number of input bumps 230. For example, the columns of output bumps 220 may be greater than the columns of input bumps 230 in the long side direction DR1. Since the input bumps 230 and the output bumps 220 are arranged differently from each other, spaced distances between the input bumps 230 and the input pads 140 may be different from those between the output bumps 220 and the output pads 130.

Referring to FIG. 8, the first conductive ball group 320 includes conductive balls having diameters that gradually decrease in the short side direction DR2. The second conductive ball group 330 includes conductive balls having diameters that gradually increase in the short side direction DR2. The short side direction DR2 is directed away from the display area VA. The first conductive ball group 320 includes conductive balls having diameters that gradually increase to the display area VA. The second conductive ball group 330 includes conductive balls having diameters that gradually increase in a direction away from the display area VA.

The input bumps 230 may have an arrangement different from that of the output bumps 220. The degree of warpage of the driving IC 210 in the output region AA may be different from the degree of warpage of the driving IC 210 in the input region BB. Therefore, the conductive balls of the first conductive ball group 320 may have diameters different from those of the conductive balls of the second conductive ball group 330.

For example, the driving IC 210 of the output region AA which includes the output bumps 220 may be more bent than the driving IC 210 of the input region BB which includes the input bumps 230. Therefore, the conductive balls of the first conductive ball group 320 may have diameters greater than those of the conductive balls of the second conductive ball group 330.

Figure 9:
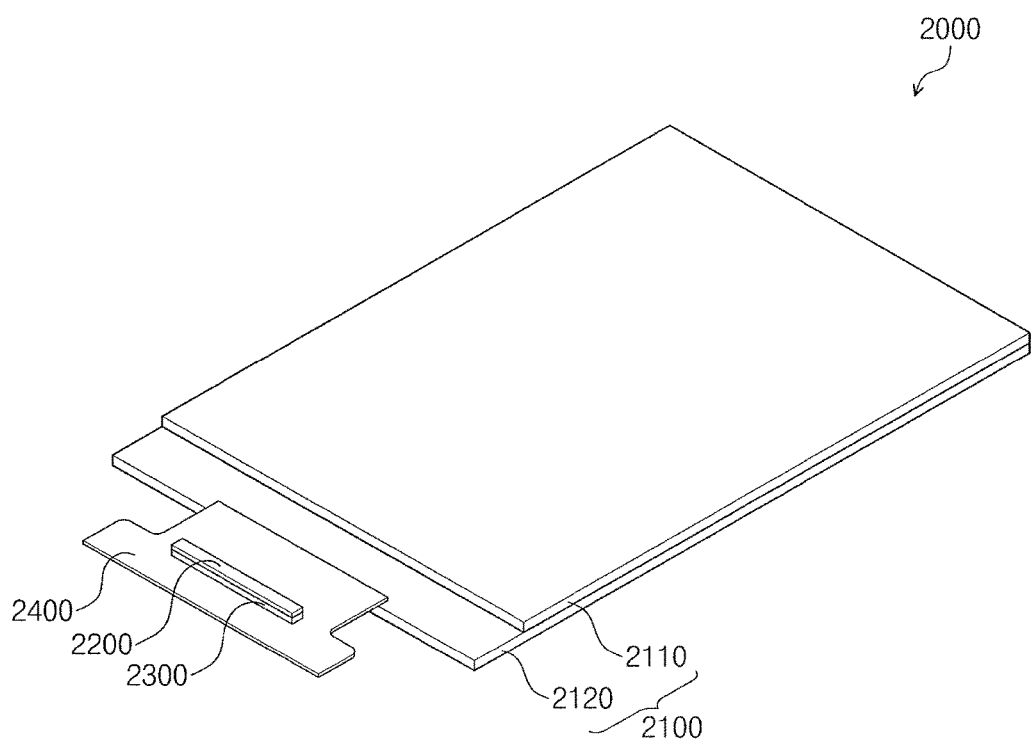
FIG. 9 illustrates another embodiment of a display apparatus.

FIG. 9 illustrates another embodiment of a display apparatus 2000 which includes a display panel 2100, a driving IC (2200), an anisotropic conductive film 2300, and a flexible circuit board 2400. The display panel 2100 includes an upper substrate 2110 and a lower substrate 2120. The flexible circuit board 2400 is attached to the lower substrate 2120.

The driving IC 2200 overlaps the flexible circuit board 2400 and is mounted on the flexible circuit board 2400. The driving IC 2200 may be attached to the flexible circuit board 2400 through the chip-on-glass (COG) method.

The anisotropic conductive film 2300 is between the flexible circuit board 2400 and the driving IC 2200. The anisotropic conductive film 2300 attaches the driving IC 2200 to the flexible circuit board 2400.

The anisotropic conductive film 2300 includes a first conductive ball group 2320 and a second conductive ball group 2330. The second conductive ball group 2330 may be spaced farther away from the display area VA than the first conductive ball group 2320. The first conductive ball group 2320 includes conductive balls having diameters that gradually increase to the display area VA. The second conductive ball group 2330 may include conductive balls having the same diameter. The second conductive ball group 2330 may include conductive balls having diameters that gradually increase in a direction away from the display area VA.

Figure 10:
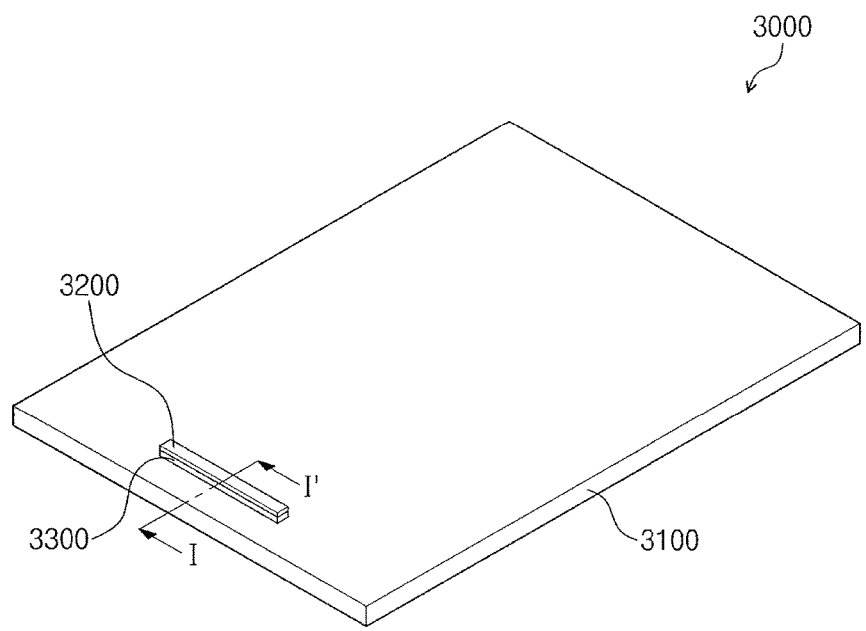
FIG. 10 illustrates another embodiment of an electronic device.
Figure 11:
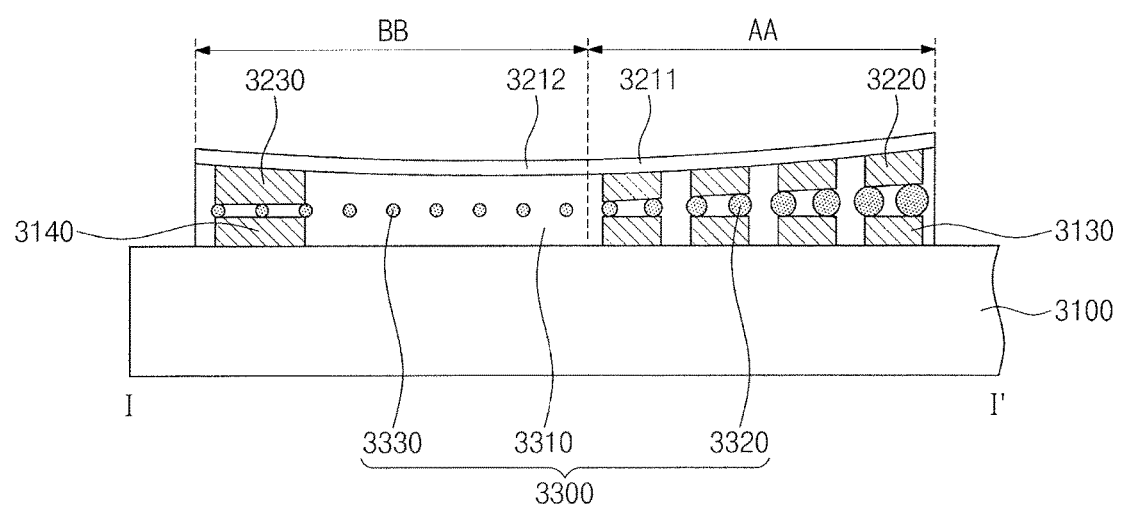
FIG. 11 illustrates another view of the electronic device.

FIG. 10 illustrates an embodiment of an electronic device 3000, and FIG. 11 is a cross-sectional view of the electronic device 3000 taken along line I-I' of FIG. 10.

Referring to FIGS. 10 and 11, the electronic device 3000 includes a base substrate 3100, a driving IC 3200, and an anisotropic conductive film 3300. The electronic device 3000 may be one, for example, that has image processing, communication, and/or mechanical control capabilities. Therefore, electronic device 3000 may be any powered device.

The driving IC 3200 is mounted on the base substrate 3100. The driving IC 3200 includes an input part 3212 and an output part 3211. The output pat 3212 overlaps the input region BB, and the output part 3211 overlaps the output region AA. The input part 3212 receives an external signal, and the output part 3211 applies a signal to the base substrate 3100. The driving IC 3200 may further include input bumps 3230 between the input part 3212 and the base substrate 3100. The driving IC 3200 may further include output bumps 3220 between the output part 3211 and the base substrate 3100.

The anisotropic conductive film 3300 is between the base substrate 3100 and the driving IC 3200. The anisotropic conductive film 3300 attaches the driving IC 3200 to the base substrate 3100.

The anisotropic conductive film 3300 may includes an adhesion resin 3310, a first conductive ball group 3320, and a second conductive ball group 3330. The first conductive ball group 3320 is between the output bumps 3320 and the base substrate 3100. The first conductive ball group 3320 includes conductive balls having diameters that gradually increase in a direction away from the input part 3212. The second conductive ball group 3330 is between the input bumps 3230 and the base substrate 3100. The second conductive ball group 3330 may include conductive balls having the same diameter. The second conductive ball group 3330 may include conductive balls having diameters that gradually increase in a direction away from the output part 3211.

In accordance with one or more of the aforementioned embodiments, a display apparatus and electronic device is provided in which conductive balls of an anisotropic conductive film have different diameters at different positions in order to prevent the connection failure between the substrate and the driving IC.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display apparatus, comprising:
a display panel including a non-display area adjacent to a display area, the display panel including a display substrate;
a driving integrated circuit (IC) overlapping the non-display area on a plane and on the display substrate; and
an anisotropic conductive film between the display substrate and the driving IC, the anisotropic conductive film attaching the driving IC to the display substrate, wherein:
the anisotropic conductive film includes a first conductive ball group and a second conductive ball group, the second conductive ball group being farther away from the display area than the first conductive ball group,
the first conductive ball group includes at least a first row and a second row of conductive balls, the second row being closer to the display area than the first row, the conductive balls of the second row having diameters that are larger than diameters of the conductive balls of the first row,
the second conductive ball group includes at least a third row and a fourth row of conductive balls, the conductive balls of the third row having diameters that are equal to the diameters of the conductive balls of the fourth row, and
the driving IC includes input bumps contacting conductive balls of the third and fourth rows of the second conductive ball group, and output bumps contacting conductive balls of the first and second rows of the first conductive ball group,
wherein the conductive balls of the first conductive ball group are regularly arranged having volumes that gradually increase toward the display area.
2. The display apparatus as claimed in claim 1, wherein the driving IC further includes:
a driving chip to drive the display panel.
3. The display apparatus as claimed in claim 1, wherein a number of output bumps is greater than a number of input bumps.
4. The display apparatus as claimed in claim 1, wherein the display panel includes:
output pads facing the output bumps with the first conductive ball group therebetween; and
input pads facing the input bumps with the second conductive ball group therebetween.
5. The display apparatus as claimed in claim 1, wherein distances between centers of adjacent conductive balls of the second conductive ball group are equal.
6. The display apparatus as claimed in claim 1, wherein distances between centers of adjacent conductive balls of the first conductive ball group are equal.
7. The display apparatus as claimed in claim 1, wherein the conductive balls of the first conductive ball group include at least some conductive balls having a diameter of 3.0 μm to 3.2 μm.
8. An electronic device, comprising:
a base substrate including a non-display area adjacent to a display area;
a driving integrated circuit (IC) on the base substrate; and
an anisotropic conductive film between the base substrate and the driving IC and attaching the driving IC to the base substrate, wherein:
the driving IC includes an input to receive an external signal and an output to apply a signal to the base substrate,
the anisotropic conductive film includes a first conductive ball group between the output and the base substrate, and includes a second conductive ball group,
the first conductive ball group includes at least a first row and a second row of conductive balls, the conductive balls of the second row having diameters that are larger than diameters of the conductive balls of the first row,
the second conductive ball group includes at least a third row and a fourth row of conductive balls, the conductive balls of the third row having diameters that are equal to the diameters of the conductive balls of the fourth row, and
the input of the driving IC includes input bumps contacting conductive balls of the third and fourth rows of the second conductive ball group, and the output of the driving IC includes output bumps contacting conductive balls of the first and second rows of the first conductive ball group,
wherein the conductive balls of the first conductive ball group are regularly arranged having volumes that gradually increase toward the display area.
9. A display apparatus, comprising:
a display substrate including a non-display area adjacent to a display area;
a driving integrated circuit (IC); and
an anisotropic conductive film between the display substrate and the driving IC, the anisotropic conductive film attaching the driving IC to the display substrate, wherein:
the anisotropic conductive film includes a first conductive ball group and a second conductive ball group,
the first conductive ball group includes at least a first row and a second row of conductive balls, the conductive balls of the second row having volumes that are larger than volumes of the conductive balls of the first row,
the second conductive ball group includes at least a third row and a fourth row of conductive balls, the conduc- tive balls of the third row having volumes that are equal to the volumes of the conductive balls of the fourth row, and the driving IC includes first bumps contacting conductive balls of the third and fourth rows of the second conductive ball group, and second bumps contacting conductive balls of the first and second rows of the first conductive ball group, wherein the conductive balls of the first conductive ball group are regularly arranged having volumes that gradually increase toward the display area.

\* \* \* \* \*